(12) United States Patent
Kim et al.

(10) Patent No.: US 9,148,150 B2
(45) Date of Patent: Sep. 29, 2015

(54) LOGIC DEVICE AND OPERATING METHOD THEREOF

(71) Applicant: Samsung Electronics Co., Ltd., Suwon-si, Gyeonggi-Do (KR)

(72) Inventors: Ho-jung Kim, Suwon-si (KR); U-in Chung, Seoul (KR); Hyun-sik Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 88 days.

(21) Appl. No.: 13/921,642

(22) Filed: Jun. 19, 2013

(65) Prior Publication Data

US 2014/0125378 A1    May 8, 2014

(30) Foreign Application Priority Data

Nov. 5, 2012    (KR) .................. 10-2012-0124465

(51) Int. Cl.
*H01L 25/00*    (2006.01)
*H03K 19/177*    (2006.01)
*G06F 17/50*    (2006.01)
*H03K 19/173*    (2006.01)

(52) U.S. Cl.
CPC ........ *H03K 19/173* (2013.01); *H03K 19/17728* (2013.01); *G06F 17/5054* (2013.01); *H03K 19/17736* (2013.01)

(58) Field of Classification Search
CPC ............... H03K 19/17736; H03K 19/17728; H03K 19/17704; G06F 17/5054; G06F 17/5045
USPC ................................. 326/37–41, 47; 716/116
See application file for complete search history.

(56) References Cited

U.S. PATENT DOCUMENTS

| 7,103,000 | B1 |   | 9/2006 | Rode et al. |
|---|---|---|---|---|
| 7,852,114 | B2 | * | 12/2010 | Bertin et al. ................. 326/38 |
| 7,859,303 | B2 |   | 12/2010 | Kang |
| 8,082,526 | B2 | * | 12/2011 | Hutton et al. ................ 716/100 |
| 8,344,755 | B2 | * | 1/2013 | Chandler et al. .............. 326/38 |
| 2007/0146012 | A1 | * | 6/2007 | Murphy et al. ................ 326/99 |
| 2011/0254587 | A1 | * | 10/2011 | Chua-Eoan et al. ........... 326/39 |
| 2011/0273205 | A1 | * | 11/2011 | Hioki ............................. 326/38 |
| 2012/0326747 | A1 |   | 12/2012 | Jeong et al. |

FOREIGN PATENT DOCUMENTS

| JP | 2647321 B2 | 8/1997 |
|---|---|---|
| KR | 20010040584 A | 5/2001 |
| KR | 20050030597 A | 3/2005 |
| KR | 20050111398 A | 11/2005 |
| KR | 20060025176 A | 3/2006 |
| KR | 20090077840 A | 7/2009 |
| KR | 20120019304 A | 3/2012 |
| KR | 20030057487 A | 7/2013 |

* cited by examiner

*Primary Examiner* — Dylan White
(74) *Attorney, Agent, or Firm* — Harness, Dickey & Pierce, P.L.C.

(57) ABSTRACT

A logic device includes first and second logic blocks and a connection block. Each of the first and second logic blocks configured to perform at least one function, the first logic blocks connected to first connection lines and the second logic blocks connected to second connection lines. The connection block electrically connected to the first and second logic blocks via the first connection lines and the second connection lines, respectively. The connection block including connection cells configured to select one of multiple connection configurations between the first connection lines and the second connection lines based on a desired function.

19 Claims, 11 Drawing Sheets

LOGIC DEVICE AND OPERATING METHOD THEREOF

CROSS-REFERENCE TO RELATED APPLICATIONS

This application claims the benefit of Korean Patent Application No. 10-2012-0124465, filed on Nov. 5, 2012, in the Korean Intellectual Property Office, the disclosure of which is incorporated herein in its entirety by reference.

BACKGROUND

1. Field

Some example embodiments relate to a logic device and/or an operating method thereof.

2. Description of the Related Art

Recently, configurable or re-configurable logic devices, such as programmable logic devices (PLDs), which may be designed by users, have been widely used. Users may control connection between signal lines included in the logic device to configure or re-configure the logic device to thereby implement a desired function.

SUMMARY

Provided are a logic device and an operating method thereof, in which included logic blocks may be connected for efficient reconfiguration.

Additional aspects will be set forth in part in the description which follows and, in part, will be apparent from the description, or may be learned by practice of the presented example embodiments.

According to an example embodiment, a logic device includes first and second logic blocks, each of the first and second logic blocks configured to respectfully perform at least one function, the first logic blocks connected to first connection lines and the second logic blocks connected to second connection lines; and a connection block electrically connected to the first and second logic blocks via the first connection lines and the second connection lines, respectively, the connection block including connection cells configured to select one of multiple connection configurations between the first connection lines and the second connection lines based on a desired function.

Each of the plurality of connection cells may include a configuring means for configuring the desired function connected between the first connection line and the second connection line according to a first configuration data value; and a storing means for configuring a connection between the first connection line and the second connection line according to a stored second configuration data value.

The configuring means may include at least one transistor configured to electrically connect the storing means to the first connection line and the second connection line according to the first configuration data value.

The storing means may be a resistive-type memory device configured to selectively connect the first connection line and the second connection line according to a resistance state.

The connection cells may be arranged in a cell array and configured to exchange data across selected ones of the connection configurations; and the connection block may include a write driver configured to write second configuration data values into associated ones of the storing means included in the connection cells in the array, if the logic device is operating in a write mode.

The connection block may further include a first configuring data decoder configured to provide the configuring means with an associated first configuration data value, if the logic device is operating in the write mode.

The connection block may include a data input unit configured to provide the data from the first and second logic blocks to the cell array, if the logic device is operating in a normal mode; and a data output unit configured to shift a voltage level of data output by the cell array.

While the connection block electrically connects the first and second logic blocks via a first one of the multiple connection configurations, the connection block is configured to select a second one of the multiple connection configurations by performing a write operation.

Each of the first one of the multiple connection configurations and the second one of the multiple connection configurations may include a configuring means, a storing means and a writing means. The configuring means for configuring the desired function connected between the first connection line and the second connection lines. The storing means for configuring a connection between the first connection lines and the second connection lines. The writing means for applying a write voltage to the storing means.

The configuring means may include a first transistor connected between one of the first connection lines and the storing means; and a second transistor connected between the storing means and one of the second connection lines.

The writing means may include a third transistor which applies a first voltage to a first terminal of the storage means, in response to a mode signal; and a fourth transistor which applies a second voltage to a second terminal of the storage means, in response to the mode signal.

While the connection block electrically connects the first and second logic blocks via a first one of the multiple connection configurations, the connection block is configured to select a second and a third one of the multiple connection configurations to connect the first and second logic blocks by performing a write operation on the connection cell.

Each of the first, second and third connection configurations may include a configuring means for configuring the desired function connected between the first connection line and the second connection line; and a storing means for configuring a connection between the first connection lines and the second connection lines. Each of the second connection configuration and the third connection configuration further include a writing means for applying a write voltage to the storing means.

The logic device may further include a third logic block configured to perform at least one function; and a second connection block electrically connected to the first logic block via the first connection lines, the second logic block via the second connection lines, and the third logic block via third connection lines.

The second connection block may have the same structure as the first connection block.

The logic device may further include a switch block configured to control a connection between the first connection block and the second connection block.

The switch block may include a plurality of the connection cells, each connection cell configured to select one of the connection configurations between the first connection lines and the second connection lines based on the desired function.

The desired function may include at least one of an error correction code (ECC) function, an arithmetic and logic unit (ALU) function, a compression function, and a security function.

At least one example embodiment relates to a method of operating a logic device having a first logic block connected to first connection lines and a second logic block connected to second connection lines.

In one example embodiment, the method includes selecting one of multiple connection configurations between the first connection lines and the second connection lines to perform a function; and re-configuring the function performed by the logic device by adjusting the multiple connection configurations without changing which one of the first connection lines and the second connection lines are connected to the logic blocks.

At least one example embodiment relates to an electronic device including a logic device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, example embodiments will be described with reference to the accompanying drawings. Throughout the drawings, like reference numerals refer to like elements.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

Figure 1:
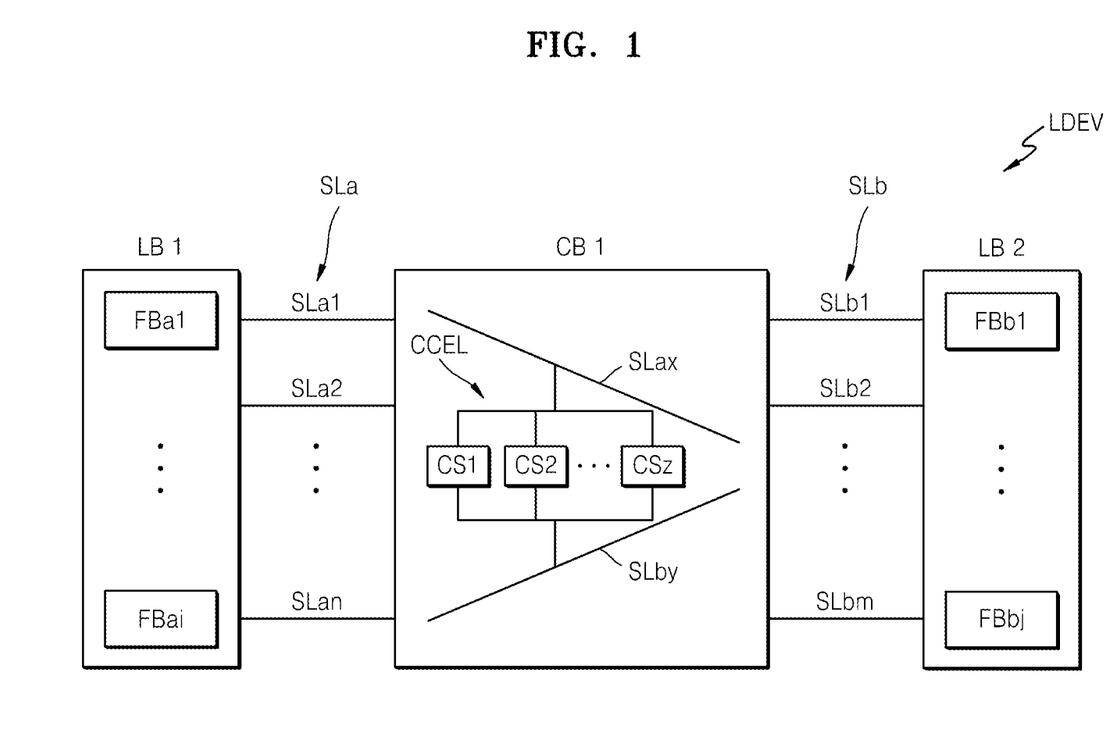
FIG. 1 is a block diagram conceptually illustrating a logic device according to an example embodiment.

FIG. 1 is a block diagram conceptually illustrating a logic device LDEV according to an example embodiment.

Referring to FIG. 1, the logic device LDEV may include a first logic block LB1, a second logic block LB2, and a first connection block CB1. The logic device LDEV is a user-programmable logic device (PLD). For example, the logic device LDEV may be a field programmable gate array (FPGA), a programmable array logic (PAL), a programmable logic array (PLA), or a Generic Array Logic (GAL).

The first logic block LB1 and the second logic block LB2 include function blocks FBa1 through FBai and FBb1 through FBbj, respectively, to perform at least one function. The number of function blocks of the first logic block LB1 and the second logic block LB2 may be equal to each other (i=j) or different from each other (i≠j).

The functions of the function blocks FBa1 through FBai and FBb1 through FBbj of the first logic blocks LB1 and the second logic blocks LB2 may be configured or re-configured, and they may perform the configured or re-configured functions. For example, the function blocks FBa1 through FBai and FBb1 through FBbj of the first logic blocks LB1 and the second logic blocks LB2 may perform at least one of an error correction code (ECC) function, an arithmetic and logic unit (ALU) function, a compression function, and a security function.

For example, once the ALU function is configured in one of the function blocks FBa1 through FBai of the first logic block LB1 or the function blocks FBb1 through FBbj of the second logic block LB2, the first logic block LB1 or the second logic block LB2 may perform the ALU function. If the compression function is re-configured in an ALU-function-configured arbitrary function block of the first logic block LB1 or the second logic block LB2, the first logic block LB1 or the second logic block LB2 may perform the compression function. That is, after one of a plurality of functions is configured in the first logic block LB1 or the second logic block LB2 at the request of a user or a host, another function may be reconfigured therein. Hereinbelow, the term "configuration" may be used to include the concept of "reconfiguration"

A result of performing a function of the function block(s) of the first logic block LB1 may be provided as inputs to the second logic block LB2. A result of performing a function of the function block(s) of the second logic block LB2 may be provided as inputs to the first logic block LB1.

The first connection block CB1 controls connection between the first logic block LB1 and the second logic block LB2. The first connection block CB1 is connected with the first logic block LB1 through a first connection line group SLa. The first connection block CB1 is connected with the second logic block LB2 through a second connection line group SLb. The first connection line group SLa and the second connection line group SLb include first connection lines SLa1 through SLan and second connection lines SLb1 through SLbm, respectively. The number of first connection lines SLa1 through SLan included in the first connection line group SLa and the number of second connection lines SLb1 through SLbm included in the second connection line group SLb may be equal to each other (n=m) or different from each other (n≠m).

The first connection block CB1 includes a connection cell CCEL which configures a connection relationship between a first connection line SLax, which is one of the first connection lines SLa1 through SLan included in the first connection line group SLa and a second connection line SLby, which is one of the second connection lines SLb1 through SLbm included in the second connection line group SLb. While the first connection block CB1 includes only one connection cell CCEL for the first connection line SLax and the second connection line SLby in FIG. 1, such illustration is merely for convenience. The first connection block CB1 may include connection cells CCEL, respectively, for the first connection lines SLa1 through SLan included in the first connection line group SLa and the second connection lines SLb1 through SLbm included in the second connection line group SLb.

Each connection cell CCEL may include multiple connection configurations CS1 through CSz. Each of the multiple connection configurations CS1 through CSz may be configuration for a function type and connection, as will be described in more detail below.

Figure 2:
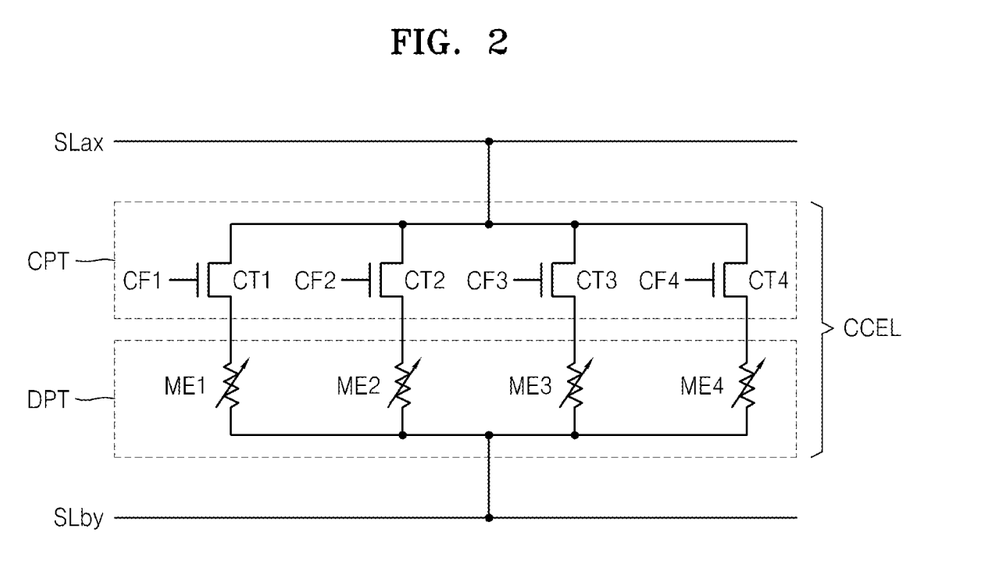
FIG. 2 is a diagram illustrating an example of a connection cell illustrated in FIG. 1.

FIG. 2 is a diagram illustrating an example embodiment of the connection cell CCEL illustrated in FIG. 1.

Referring to FIGS. 1 and 2, the connection cell CCEL according to an example embodiment may include four connection configurations CS1 through CS4. However, the number of connection configurations CS1 through CSz included in the connection cell CCEL, that is, a value of z, is merely an example, and may correspond to the number of bits of first configuration data CF to be described later.

The first connection line SLax and the second connection line SLby may be connected by one of the four connection configurations CS1 through CS4. Each of the connection configurations CS1 through CS4 may include a configuring means CPT and a storing means DPT.

The configuring means CPT may configure a connected function type of the first connection line SLax and the second connection line SLby according to first configuration data values CF1 through CF4. The functions may include the error correction code (ECC) function, the arithmetic and logic unit (ALU) function, the compression function, and the security function.

For example, if the first configuration data value CF1 of 2 bits is 00, a first transistor CT1 of the configuring means CPT is turned on such that a connection between the first connection line SLax and the second connection line SLby by means of a first storage element ME1 of the storing means DPT may be configured for the ECC function. If the first configuration data value CF2 of 2 bits is 01, a second transistor CT2 of the configuring means CPT is turned on such that a connection between the first connection line SLax and the second connection line SLby by means of a second storage element ME2 of the storing means DPT may be configured for the ALU function. If the first configuration data value CF3 of 2 bits is 10, a third transistor CT3 of the configuring means CPT is turned on such that a connection between the first connection line SLax and the second connection line SLby by means of a third storage element ME3 of the storing means DPT may be configured for the compression function. If the first configuration data value CF4 of 2 bits is 11, a fourth transistor CT4 of the configuring means CPT is turned on such that a connection between the first connection line SLax and the second connection line SLby by means of a fourth storage element ME4 of the storing means DPT may be configured for the security function.

That is, the configuring means CPT controls activation of a corresponding storage element according to the first configuration data values CF1 through CF4. Herein, activation of a storage element means that one terminal of the storage element is electrically connected with the first connection line SLax such that the first connection line SLax and the second connection line SLby are connected or not connected according to a value stored in the storage element (or a storage state).

While the configuring means CPT is implemented with the first through fourth transistors CT1 through CT4, which are gated in response to the first configuration data CF in FIG. 2, the present disclosure is not limited thereto. The configuring means CPT may be implemented with other switching elements which perform switching according to the first configuration data CF.

The storing means DPT may include at least one storage element indicating a connection between the first connection line SLax and the second connection line SLby. The storing means DPT may include the first through fourth storage elements ME1 through ME4 which are connected to one of the terminals of a corresponding transistor of the configuring means CPT. The first through fourth storage elements ME1 through ME4 may be, for example, a resistive-type memory element, a magnetic memory element, or a flash memory element. For example, when the first through fourth storage elements ME1 through ME4 are resistive-type memory elements such as resistive random-access memory (RRAM), if the first through fourth storage elements ME1 through ME4 are programmed with "1", they enter a high-resistance state; otherwise, if they are programmed with "0", they enter a low-resistance state. When the first through fourth storage elements ME1 through ME4 are in the high-resistance state, the first connection line SLax and the second connection line SLby are not connected by the first through fourth storage elements ME1 through ME4. On the other hand, when the first through fourth storage elements ME1 through ME4 are in the low-resistance state, the first connection line SLax and the second connection line SLby are connected by the first through fourth storage elements ME1 through ME4.

In FIG. 2, the configuring means CPT and the first connection line SLax are located adjacent to each other, and the storing means DPT and the second connection line SLby are located adjacent to each other. However, the configuring means CPT and the second connection line SLby may be located adjacent to each other, and the storing means DPT and the first connection line SLax may be located adjacent to each other.

Figure 3:
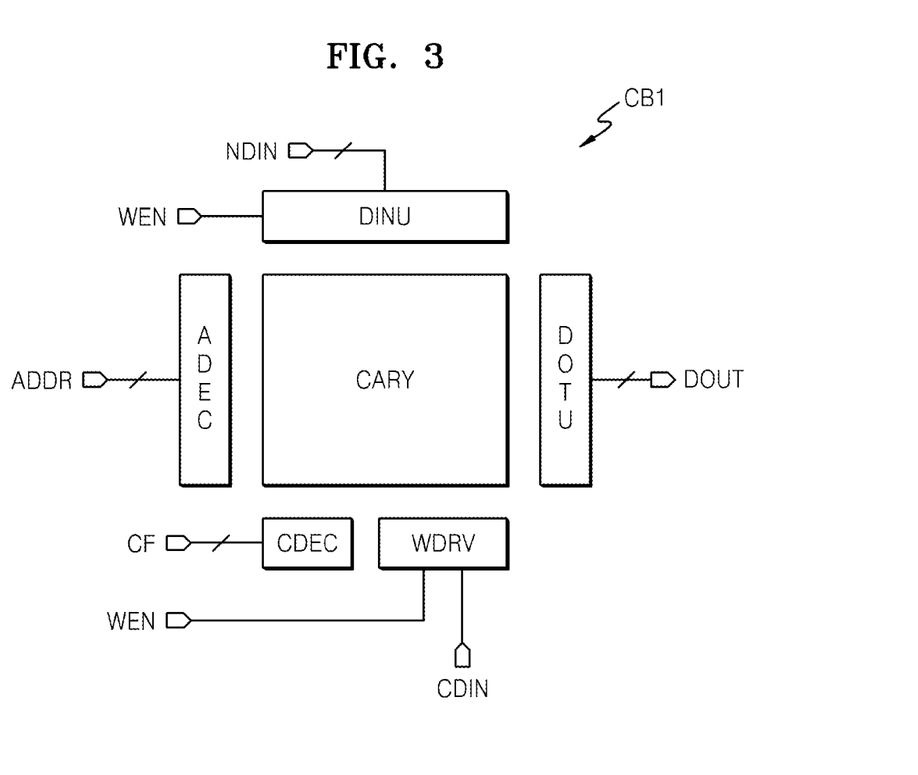
FIG. 3 is a diagram illustrating an example of a first connection block illustrated in FIG. 1.

FIG. 3 is a diagram illustrating an example of the first connection block CB1 illustrated in FIG. 1.

Referring to FIGS. 1 and 3, the first connection block CB1 according to an example embodiment may include a cell array CARY, a data input unit DINU, a data output unit DOTU, a write driver WDRV, an address decoder ADEC, and a first configuration data decoder CDEC. The cell array CARY may include a plurality of previous connection cells CCEL, respectively, connected to the first connection lines SLa1 through SLan and the second connection lines SLb1 through SLbm.

Figure 4:
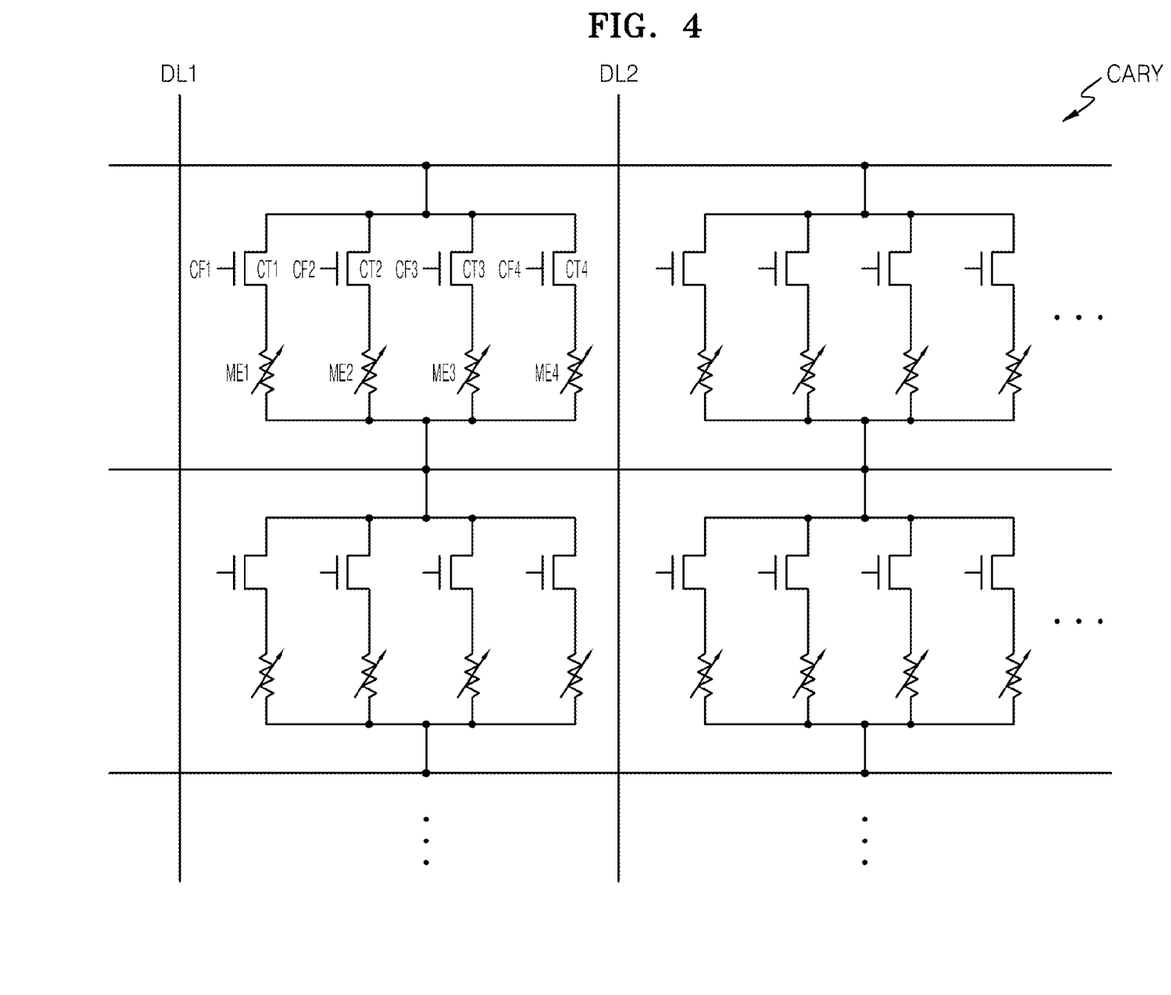
FIG. 4 is a diagram illustrating an example of a cell array illustrated in FIG. 3.

FIG. 4 is a diagram illustrating an example of the cell array CARY including the plurality of connection cells CCEL illustrated in FIG. 2.

In FIG. 4, data lines DL may be the first connection lines SLa1 through SLan or the second connection lines SLb1 through SLbm illustrated in FIG. 1. For example, if a signal or data is transmitted from the first logic block LB1 to the second logic block LB2, the data lines DL may be the second connection lines SLb1 through SLbm. In this case, other lines which are orthogonal to the data lines DL may be the first connection lines SLa1 through SLan. On the other hand, if a signal or data is transmitted from the second logic block LB2 to the first logic block LB1, the data lines DL may be the first connection lines SLa1 through SLan. In this case, other lines which are orthogonal with the data lines DL may be the second connection lines SLb1 through SLbm.

Referring back to FIGS. 1 and 3, the first connection block CB1 may operate in one of two modes, a normal mode and a write mode. The normal mode is a mode in which a connection operation between the first connection line SLax and the second connection line SLby is performed according to a configuration of the connection cell CCEL, and in the write mode, a write operation for configuring the connection cell CCEL is performed.

Operation of the First Connection Block CB1 in the Normal Mode.

Figure 5:
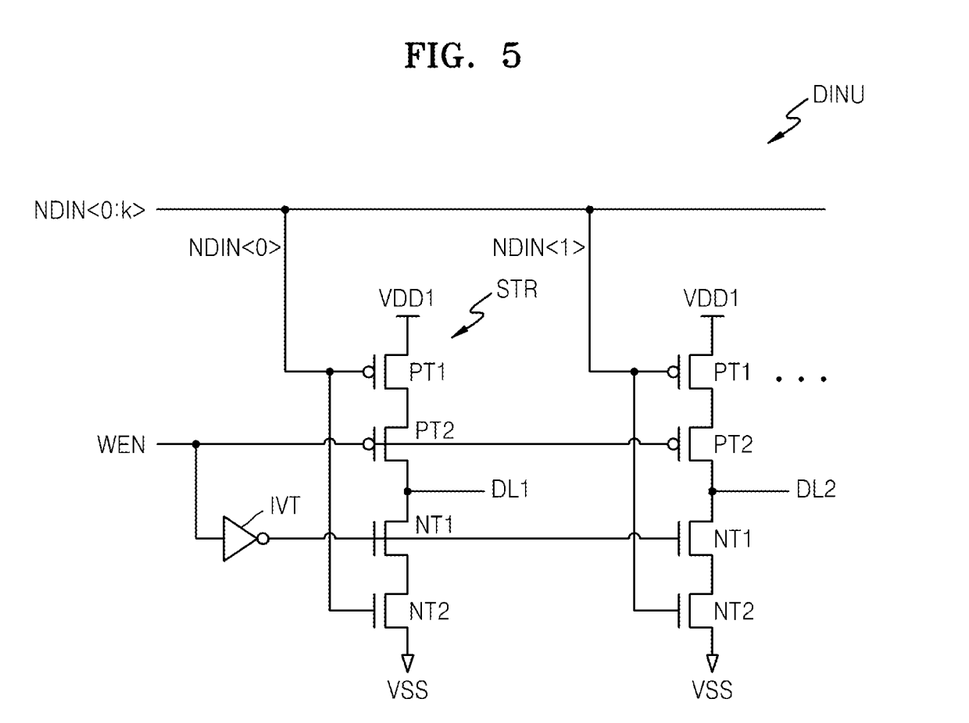
FIG. 5 is a diagram illustrating an example of a data input unit illustrated in FIG. 3.

The data input unit DINU illustrated in FIG. 3 may be implemented as illustrated in FIG. 5. The data input unit DINU receives normal data NDIN, shifts a voltage level to a voltage corresponding to the normal data NDIN (a first power voltage VDD1 or a ground voltage VSS illustrated in FIG. 5), and applies the shifted voltage to the cell array CARY. For example, the normal data NDIN may be data delivered from the first logic block LB1 to the second logic block LB2 or data delivered from the second logic block LB2 to the first logic block LB1.

The data input unit DINU may include strings STR, respectively, connected to the data lines DL corresponding to the cell array CARY, as illustrated in FIG. 5. Each of the strings STR may include two PMOS transistors, namely, first and second PMOS transistors PT1 and PT2, which are connected in series and two NMOS transistors, namely, first and second NMOS transistors NT1 and NT2, which are connected in series. In each string STR, the first PMOS transistor PT1, the second PMOS transistor PT2, the first NMOS transistor NT1, and the second NMOS transistor NT2 may be sequentially connected in that order.

Gates of the first PMOS transistor PT1 and the second NMOS transistor NT2 of each string STR are connected with a corresponding bit of the normal data NDIN. For example, to the gates of the first PMOS transistor PT1 and the second NMOS transistor NT2 of the string STR to which a first bit (NDIN<0>) of the normal data NDIN is applied, a voltage corresponding to the first bit (NDIN<0>) of the normal data NDIN may be applied.

A write enable signal WEN and an inverted signal thereof may be applied to gates of the second PMOS transistor PT2 and the first NMOS transistor NT1 of each string STR. The write enable signal WEN may have a logic level of high (H) when the write mode is performed to configure or re-configure a resistance state or a storage value of the first through fourth storage elements ME1 through ME4 illustrated in FIG. 2.

In the write mode, both the second PMOS transistor PT2 and the first NMOS transistor NT1 are turned off. Thus, the data input unit DINU is deactivated, and thus it does not apply the normal data NDIN to the cell array CARY.

In the normal mode, the write enable signal WEN has a logic level of low (L), such that both the second PMOS transistor PT2 and the first NMOS transistor NT1 are turned on. Therefore, one of the first power voltage VDD1 and the ground voltage VSS is applied to a node which connects the second PMOS transistor P2 and the first NMOS transistor NT1, through one of the first PMOS transistor PT1 and the second NMOS transistor NT2 according to a bit value of the normal data NDIN. The first power voltage VDD1 may be lower than a second power voltage VDD2, illustrated in FIG. 6, which is used for a write operation with respect to a storage element in the write mode.

The voltage at the node is applied to the corresponding data line DL of the cell array CARY. For example, if the first bit of the normal data NDIN is 1 (NDIN<1>) in the normal mode, the first power voltage VDD1 is applied to the first data line DL1.

Figure 6:
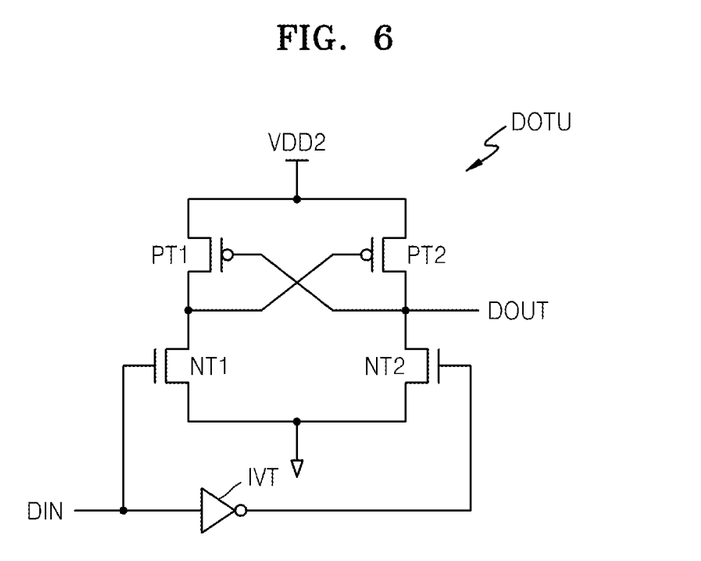
FIG. 6 is a diagram illustrating an example of a data output unit illustrated in FIG. 3.

FIG. 6 illustrates an example embodiment of the data output unit illustrated in FIG. 3.

As illustrated in FIG. 6, the data output unit DOTU outputs data DOUT from the cell array CARY. For example, the data output unit DOTU may output normal data transmitted between the first connection line SLax and the second connection line SLby between which a connection relationship is configured by the connection cells CCEL of the cell array CARY in the normal mode.

The data output unit DOTU may include a first NMOS transistor NT1 and a second NMOS transistor NT2 which are gated by the normal data NDIN and a first PMOS transistor PT1 and a second PMOS transistor PT2 whose one of their terminals are connected to the first NMOS transistor NT1 and the second NMOS transistor NT2, their other terminals are connected to the second power voltage VDD2, and their gates are connected to the second NMOS transistor NT2 and the first NMOS transistor NT1, respectively. Hence, the data output unit DOTU may perform a level shift operation of shifting the normal data NDIN having a voltage level of the first power voltage VDD1 to a voltage level of the second power voltage VDD2, together with a buffer operation.

Operation of the First Connection Block CB1 in the Write Mode.

Referring to FIGS. 1 and 3, the address decoder ADEC decodes an address ADDR to configure an address of the connection cell CCEL to be configured or re-configured. The first configuration data decoder CDEC decodes the first configuration data CF to configure or re-configure the configuring means CPT of the connection cell CCEL having the address ADDR decoded by the address decoder ADEC. For example, a function type managed by the first transistor CT1 of the configuring means CPT of the connection cell CCEL illustrated in FIG. 2 may be configured to be the ECC function and may be re-configured from the ECC function to the ALU function.

The write driver WDRV applies a voltage corresponding to second configuration data CDIN to be configured or re-configured in the first through fourth storage elements ME1 through ME4 of the connection cell CCEL illustrated in FIG. 2 to the data line DL and a line orthogonal to the data line DL of the cell array CARY illustrated in FIG. 4. That is, the write driver WDRV applies the voltage corresponding to the second configuration data CDIN (the second power voltage VDD2 or the ground voltage VSS) to both terminals of the first through fourth storage elements ME1 through ME4, such that the first through fourth storage elements ME1 through ME4 store corresponding resistance states or storage values to configure a connection between the first connection line SLax and the second connection line SLby by means of the corresponding storage elements.

Figure 7:
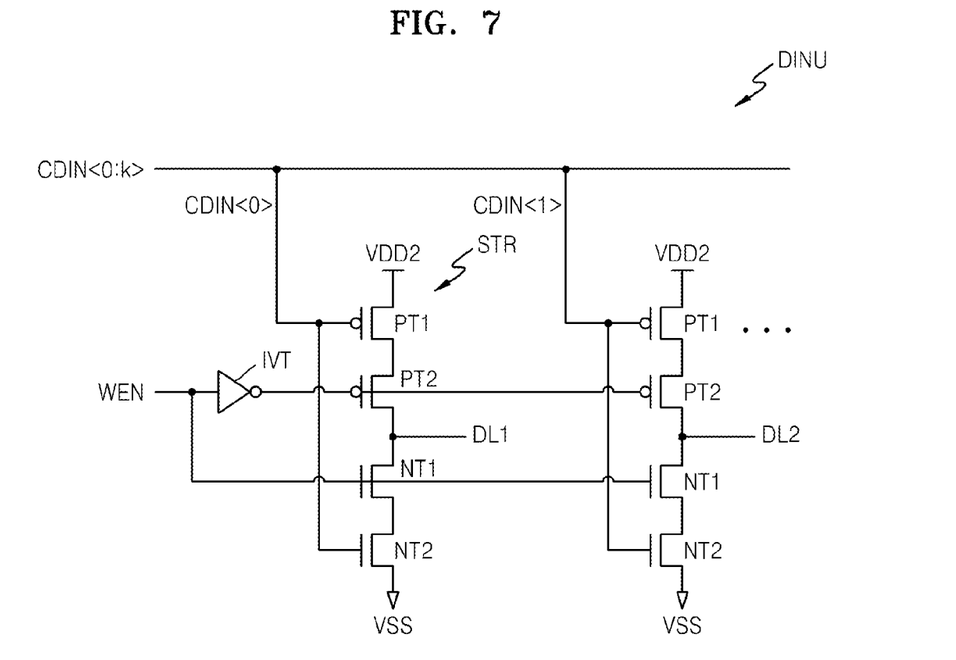
FIG. 7 is a diagram illustrating an example of a write driver illustrated in FIG. 3.

To this end, the write driver WDRV may have a structure similar to the data input unit DINU illustrated in FIG. 7. However, since a time instant when the write driver WDRV is activated and a time instant when the data input unit DINU is activated are different from each other, the second PMOS transistor PT2 and the first NMOS transistor NT1 of the write driver WDRV are deactivated when the second PMOS transistor PT2 and the first NMOS transistor NT1 of the data input unit DINU are activated in the normal mode. Therefore, at one time instant, one of the data input unit DINU and the write driver WDRV may be activated.

To this end, the logic level of the signal applied to the gates of the second PMOS transistor PT2 and the first NMOS transistor NT1 of the data input unit DINU illustrated in FIG. 5 and the logic level of the signal applied to the gates of the second PMOS transistor P2 and the first NMOS transistor NT1 of the write driver WDRV may be opposite to each other. Therefore, an inverted signal of the write enable signal WEN and the write enable signal WEN may be applied to the gates of the second PMOS transistor PT2 and the first NMOS transistor NT1 of the write driver WDRV, respectively. The write driver WDRV may further include a means (not shown) for applying storage states or storage values to the first through fourth storage elements ME1 through ME4 of the connection cell CCEL, respectively.

As such, with the logic device according to an example embodiment, a configuring means and a storing means are separated, such that a time required to configure or re-configure a connection for each function type may be reduced. With the logic device according to an example embodiment, each connection cell includes multiple connection configurations, and thus various connection configurations may be performed to thereby improve the performance of the device.

Figure 8:
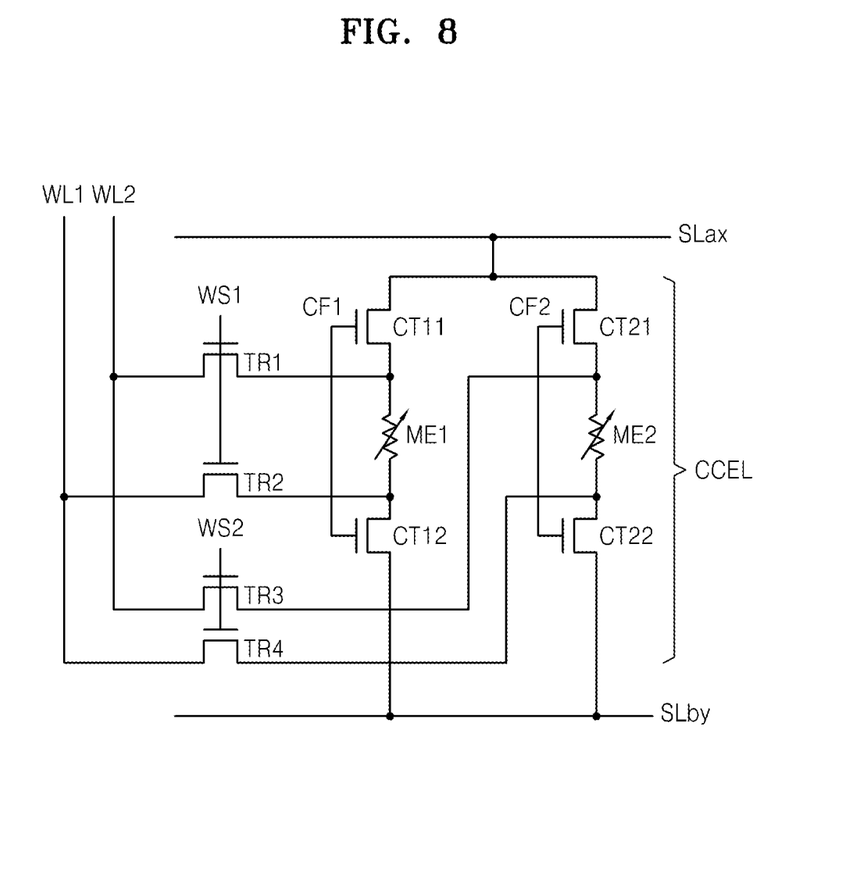
FIGS. 8 through 10 are diagrams illustrating other examples of a connection cell illustrated in FIG. 1.
Figure 9:
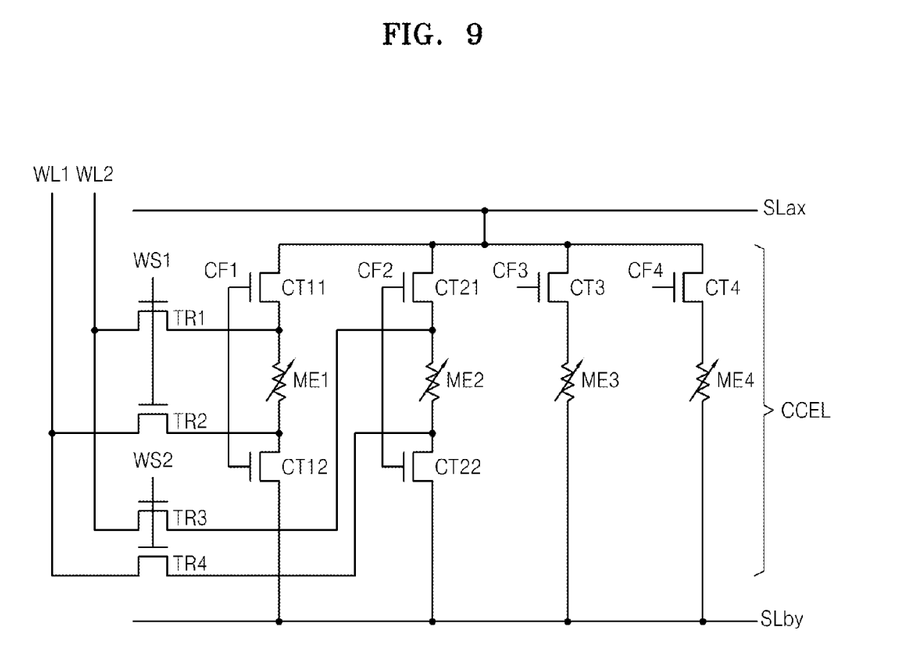
Figure 10:
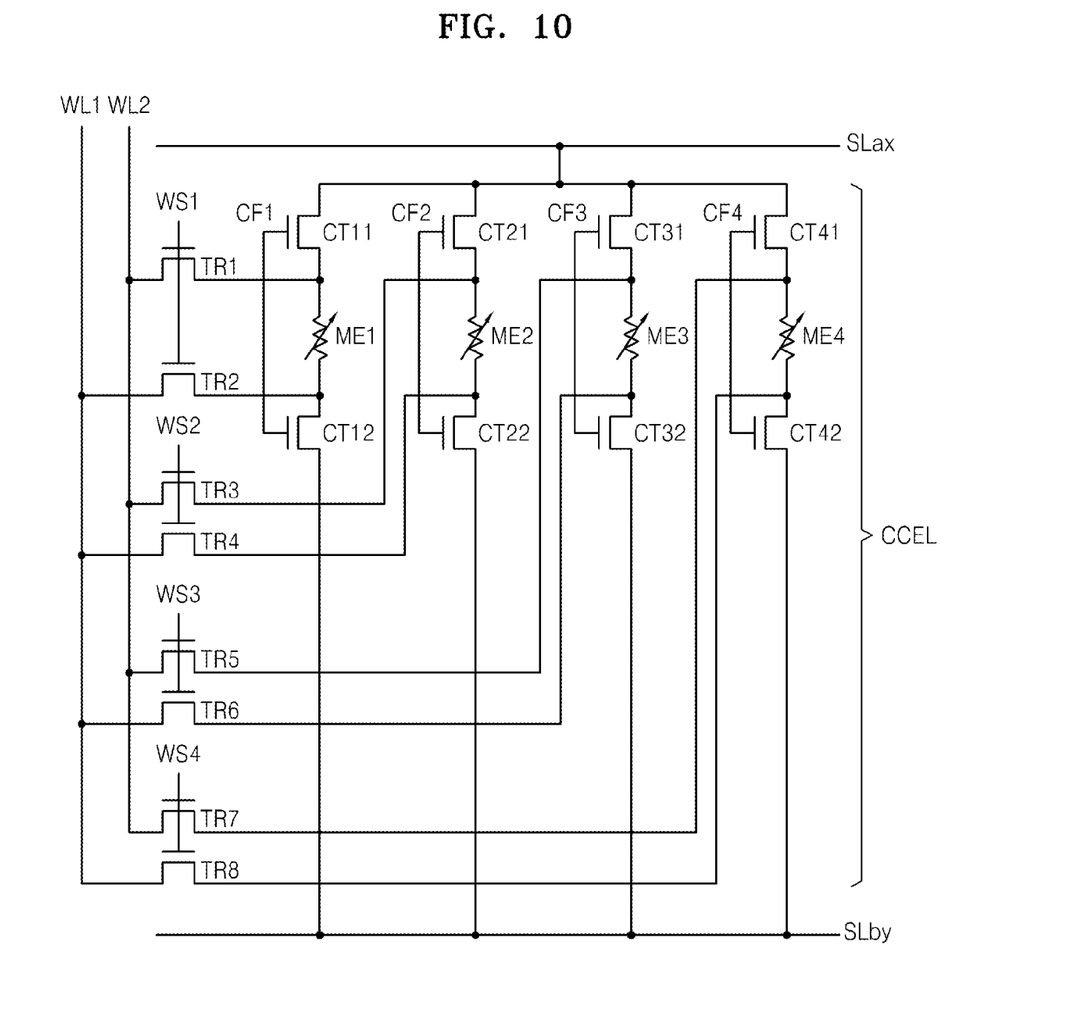

FIGS. 8 through 10 are diagrams illustrating other example embodiments of the connection cell CCEL illustrated in FIG. 1.

Referring to FIGS. 1 and 8, the connection cell CCEL may include the connection configuration CS1 and the connection configuration CS2, which configure a connection relationship between the first connection line SLax and the second connection line SLby. The connection configuration CS1 and the connection configuration CS2 include a configuring means and a storing means that are the same as those of the four connection configurations CS1 through CS4 illustrated in FIG. 2. In the connection configuration CS1 and the connection configuration CS2, the configuring means includes transistors CT11, CT12, CT21, and CT22 and the storing means includes first and second storage elements ME1 and ME2. That is, the connection configuration CS1 and the connection configuration CS2 configure a connection between the first connection line SLax and the second connection line SLby and a function of the connection.

However, when the connection relationship between the first connection line SLax and the second connection line SLby is configured by one of the connection configuration CS1 and the connection configuration CS2 illustrated in FIG. 8, a configuration or re-configuration, that is, a write operation, may be performed for the other connection configuration.

The connection configuration CS1 may include the transistors CT11 and CT12 and the first storage element ME1 that is connected between the transistors CT11 and CT12. Likewise, the second connection configuration CS2 may include the transistors CT21 and CT22, and the second storage element ME2 that is connected between the transistors CT21 and CT22.

The first storage element ME1 and the second storage element ME2 illustrated in FIG. 8, like the first through fourth storage elements ME1 through ME4 illustrated in FIG. 2, have resistance states or storage values with respect to a connection between the first connection line SLax and the second connection line SLby. The transistors CT11, CT12, CT21, and CT22 illustrated in FIG. 8 control activation of corresponding storage elements according to the first configuration data values CF1 and CF2, like the first through fourth transistors CT1 through CT4 illustrated in FIG. 2.

However, a first voltage WL1 and a second voltage WL2 may be respectively applied to both terminals of the first storage element ME1 and the second storage element ME2 illustrated in FIG. 8 through writing means, namely, transistors TR1, TR2, TR3, and TR4. The first voltage WL1 and the second voltage WL2 may be applied by the write driver WDRV illustrated in FIG. 3. According to a difference between the first voltage WL1 and the second voltage WL2, the first storage element ME1 and the second storage element ME2 may enter a high-resistance state or a low-resistance state.

The first voltage WL1 and the second voltage WL2 are applied through the transistors TR1 through TR4. For example, the transistors TR1 and TR2 are turned on in response to a first mode signal WS1, such that they apply the first voltage WL1 and the second voltage WL2 to both terminals of the first storage element ME1, respectively. Likewise, the transistors TR3 and TR4 are turned on in response to a second mode signal WS2 such that they apply the first voltage WL1 and the second voltage WL2 to both terminals of the second storage element ME2, respectively.

The first mode signal WS1 and the second mode signal WS2 are activated when a write operation is performed to configure or re-configure the connection configuration CS1 and the connection configuration CS2. For example, when first configuration data or second configuration data is written in the connection configuration CS1 to configure or re-configure the connection configuration CS1, the first mode signal WS1 may be activated. In a period in which one of the first mode signal WS1 and the second mode signal WS2 is activated, the other may be deactivated. Therefore, when connection between the first connection line SLax and the second connection line SLby is performed by one of the connection configuration CS1 and the connection configuration CS2, a write operation for configuration or re-configuration with respect to the other may be performed.

For example, when the connection configuration CS1 and the connection configuration CS2 are configured for the ECC function and the ALU function, respectively, the connection configuration CS1 performs connection for the ECC function between the first connection line SLax and the second connection line SLby and at the same time, the second connection configuration CS2 may be re-configured to the compression function rather than the ALU function. Therefore, with the logic device according to an embodiment of the present disclosure, configuration or re-configuration may be performed on a run-time basis.

In the connection cell CCEL illustrated in FIGS. 9 and 10, like in the connection cell CCEL illustrated in FIG. 8, when a connection operation is performed in one connection configuration, a write operation for configuration or re-configuration of one or more other connection configurations may be performed.

However, the connection cell CCEL illustrated in FIG. 9, unlike the connection cell CCEL illustrated in FIG. 8, may further include the connection configuration CS3 and the connection configuration CS4 for which the write operation is not performed during a connection operation in one connection configuration. The connection configuration CS3 and the connection configuration CS4 may be identical to those illustrated in FIG. 2.

The connection cell CCEL illustrated in FIG. 10 may include the connection configuration CS1 and the connection configuration CS2 illustrated in FIG. 8 and additionally may further include the connection configuration CS3 and the connection configuration CS4 which have the same structures as and perform the same operations as the connection configuration CS1 and the second connection configuration CS2 illustrated in FIG. 8. When the connection operation is performed in one of the connection configurations CS1 through CS4 illustrated in FIG. 10, the write operation may be performed in at least one of the other connection configurations.

Each connection cell CCEL of the cell array CARY illustrated in FIG. 3 may be implemented with the connection cell CCEL illustrated in one of FIGS. 8 through 10. The cell array CARY illustrated in FIG. 3 may include connection cells CCEL having different structures illustrated in FIGS. 8 through 10. The cell array CARY illustrated in FIG. 3 may include the connection cells CCEL having different structures illustrated in FIGS. 2 and 8 through 10.

Figure 11:
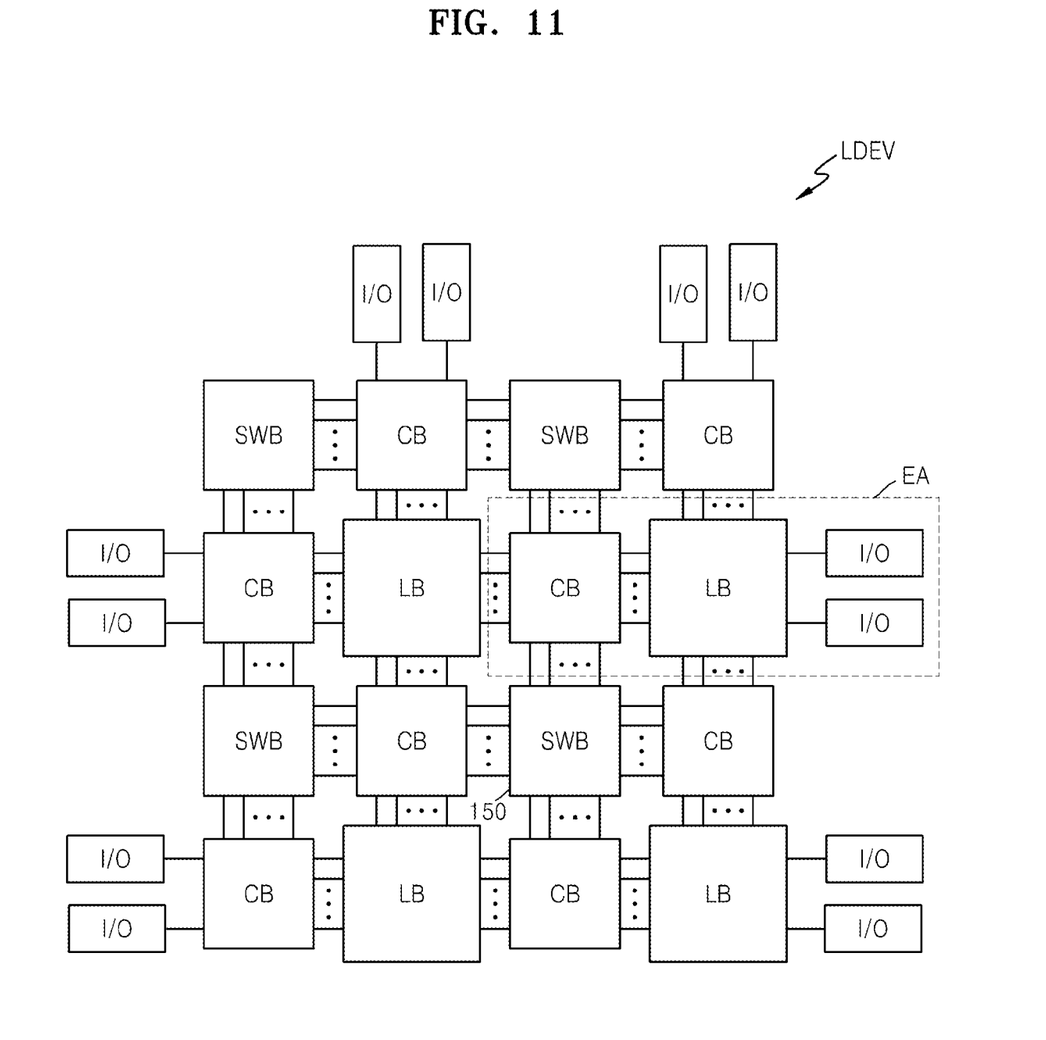
FIG. 11 is a block diagram illustrating a logic device according to another example embodiment.

FIG. 11 is a block diagram illustrating a logic device LDEV according to another embodiment of the present disclosure.

Referring to FIG. 11, the logic device LDEV may include a plurality of logic blocks LB, a plurality of connection blocks CB, a plurality of switch blocks SWB, and a plurality of input/output terminals I/O.

Each connection block CB may be disposed between the plurality of logic blocks LB or between the logic block LB and the input/output terminal I/O. Each connection block CB may control connection between the logic blocks LB or connection between the logic block LB and the input/output terminal I/O. Each switch block SWB is disposed between the plurality of connection blocks CB. Each switch block SWB may control connection between the connection blocks CB. Hence, connection between the logic blocks LB, which are not located adjacent to each other, may also be configured.

The plurality of input/output terminals I/O may be connected with the connection block CB or the logic block LB. Through the plurality of input/output terminals I/O, the logic device LDEV receives input data and outputs output data. The input data may be NDIN, CF, CDIN, or the like illustrated in FIG. 3 and the output data may be DOUT illustrated in FIG. 3.

Figure 12:
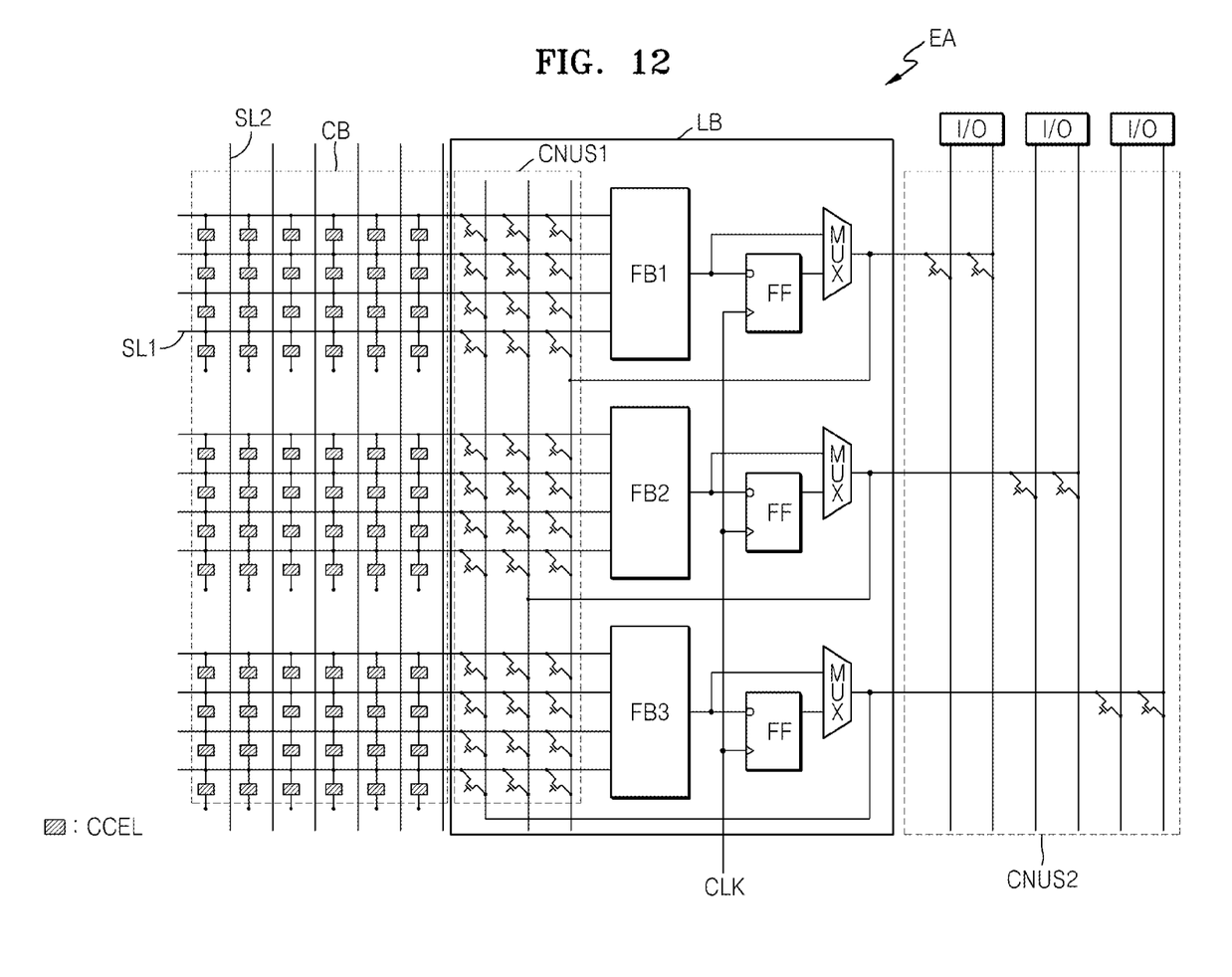
FIG. 12 is a block diagram illustrating an example of a portion of the logic device illustrated in FIG. 11, according to an example embodiment.

FIG. 12 is a block diagram illustrating an example of a portion EA of the logic device LDEV illustrated in FIG. 11, according to an example embodiment.

Referring to FIG. 12, the portion EA of the logic device LDEV illustrated in FIG. 11 may include a connection block CB, a logic block LB, and input/output terminals I/O.

The connection block CB includes a plurality of signal lines SL1 and SL2 and a plurality of connection units CCEL. The plurality of first and second signal lines SL1 and SL2 include a plurality of first signal lines SL1 formed in a first direction and a plurality of second signal lines SL2 formed in a second direction. The plurality of signal lines SL1 and SL2 may respectively be the first connection lines SLa1 through SLan and the second connection lines SLb1 through SLbm illustrated in FIG. 1, and the plurality of connection units CCEL may be the connection cells CCEL illustrated in FIG. 1.

Each connection unit CCEL controls connection between the first signal line SL1 and the second signal line SL2. Each first signal line SL1 is connected with an input terminal of function blocks FB1 through FB3.

Each logic block LB includes the function blocks FB1 through FB3. The function blocks FB1 through FB3 may be the function blocks FBa1 through FBai and FBb1 through FBbj illustrated in FIG. 1. The number of function blocks FB1 through FB3 illustrated in FIG. 1 is merely an example, and is not limited thereto.

Each logic block LB may further include a plurality of flip-flops FF and a plurality of multiplexers MUX. The flip-flops FF may receive outputs of the respective function blocks FB1 through FB3 and clock signals CLK. The multiplexers MUX may receive outputs of the function blocks FB1 through FB3 and outputs of the flip-flops FF, respectively. Timings at which the outputs of the function blocks FB1 through FB3 are output may be controlled based on the flip-flops FF and the multiplexers MUX.

The outputs of the respective function blocks FB1 through FB3 may be connected with a first connection unit set CNUS1 and a second connection unit set CNUS2. The first connection unit set CNUS1 and the second connection unit set CNUS2 include a plurality of connection units CNU, respectively. In FIG. 12, the connection units CNU of the first connection unit set CNUS1 and the second connection unit set CNUS2 are illustrated as transistors which connect the first signal line SL1 and the second signal line SL2, but the present disclosure is not limited thereto. The connection units CNU of the first connection unit set CNUS1 and the second connection unit set CNUS2 illustrated in FIG. 12 may be the connection cells CCEL illustrated in FIG. 1, like the connection unit CCEL of the connection block CB.

The first connection unit set CNUS1 may control connection between the function blocks FB1 through FB3 through the plurality of connection units CNU. For example, the output of the first function block FB1 may be input to the second function block FB2 or the third function block FB3 through the first connection unit set CNUS1. The second connection unit set CNU2 may control connection between the outputs of the respective function blocks FB1 through FB3 and the input/output terminals I/O through the plurality of connection units CNU.

Figure 13:
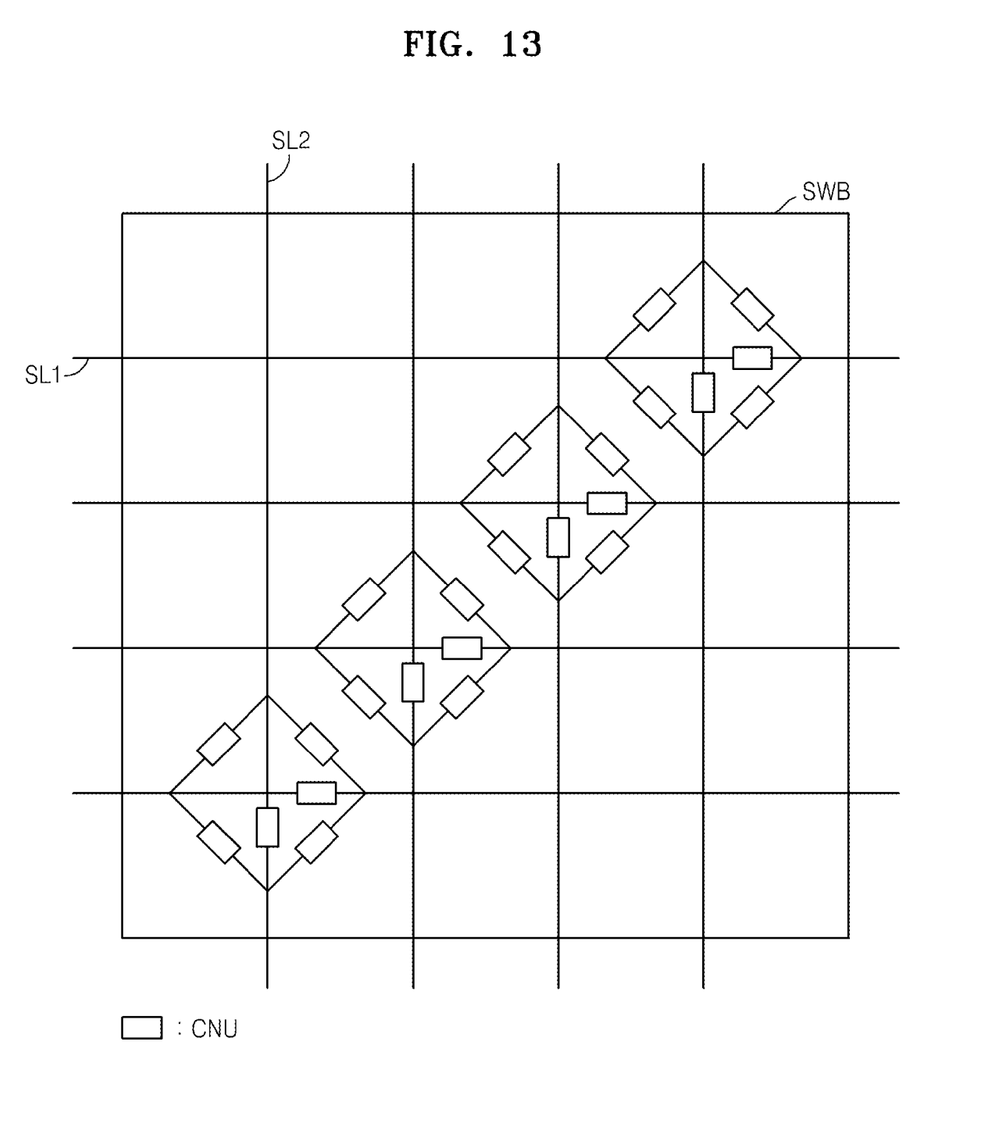
FIG. 13 is a block diagram illustrating an example of a switch block of the logic device illustrated in FIG. 11, according to an example embodiment.

FIG. 13 is a block diagram illustrating an example of the switch block SWB of the logic device LDEV according to an example embodiment.

Referring to FIG. 13, the switch block SWB includes the plurality of signal lines SL1 and SL2 and the plurality of connection units CNU and configures connection between the connection blocks CB. The plurality of signal lines SL1 and SL2 include the plurality of first signal lines SL1 formed in the first direction and the plurality of second signal lines SL2 formed in the second direction.

Each connection unit CNU is disposed between the plurality of signal lines SL1 and SL2 to control connection between the plurality of signal lines SL1 and SL2. The connection unit CNU of the switch block SWB according to an example embodiment may be the connection cell CCEL illustrated in FIG. 1.

As described above, with the logic device according to an example embodiment, the configuring means and the storing means are separated, thereby reducing a time required for configuring or re-configuring a connection for each function type. Moreover, each connection cell includes multiple connection configurations to perform various connection configurations to thereby improve the performance of the device.

Furthermore, as a write operation is possible during a connection operation, configuration or re-configuration may be performed on a run-time basis.

While the present disclosure has been particularly shown and described with reference to the example embodiments thereof, it will be understood by one of ordinary skill in the art that various changes in form and detail may be made therein without departing from the spirit and scope of the example embodiments as defined by the following claims. Accordingly, the disclosed example embodiments should be considered in a descriptive sense and not in a restrictive sense. The scope of the present disclosure will be defined by the appended claims, and differences in scope equivalent to the appended claims should be construed as being included in the present disclosure.

What is claimed is:

1. A logic device comprising:
   first and second logic blocks, each of the first and second logic blocks configured to respectfully perform at least one function, the first logic blocks connected to first connection lines and the second logic blocks connected to second connection lines; and
   a connection block electrically connected to the first and second logic blocks via the first connection lines and the second connection lines, respectively, the connection block including connection cells configured to select one of multiple connection configurations between the first connection lines and the second connection lines based on a desired function, wherein
      while the connection block electrically connects the first and second logic blocks via a first one of the multiple connection configurations, the connection block is configured to select a second one of the multiple connection configurations by performing a write operation.

2. The logic device of claim 1, wherein each of the plurality of connection cells comprises:
   a configuring means for configuring the desired function connected between the first connection line and the second connection line according to a first configuration data value; and
   a storing means for configuring a connection between the first connection line and the second connection line according to a stored second configuration data value.

3. The logic device of claim 2, wherein the configuring means comprises:
   at least one transistor configured to electrically connect the storing means to the first connection line and the second connection line according to the first configuration data value.

4. The logic device of claim 2, wherein the storing means comprises:
   a resistive-type memory device configured to selectively connect the first connection line and the second connection line according to a resistance state.

5. The logic device of claim 2, wherein the connection cells are arranged in a cell array and are configured to exchange data across selected ones of the connection configurations; and
   the connection block includes a write driver configured to write second configuration data values into associated ones of the storing means included in the connection cells in the array, if the logic device is operating in a write mode.

6. The logic device of claim 5, wherein the connection block further comprises:
   a first configuring data decoder configured to provide the configuring means with an associated first configuration data value, if the logic device is operating in the write mode.

7. The logic device of claim 5, wherein the connection block further comprises:
   a data input unit configured to provide the data from the first and second logic blocks to the cell array, if the logic device is operating in a normal mode; and
   a data output unit configured to shift a voltage level of data output by the cell array.

8. The logic device of claim 1, wherein each of the first one of the multiple connection configurations and the second one of the multiple connection configurations comprises:
   a configuring means for configuring the desired function connected between the first connection line and the second connection line;
   a storing means for configuring a connection between the first connection lines and the second connection lines; and
   a writing means for applying a write voltage to the storing means.

9. The logic device of claim 8, wherein the configuring means comprises:
   a first transistor connected between one of the first connection lines and the storing means; and
   a second transistor connected between the storing means and one of the second connection lines.

10. The logic device of claim 8, wherein each of the writing means comprise:
    a third transistor which applies a first voltage to a first terminal of the storage means, in response to a mode signal; and
    a fourth transistor which applies a second voltage to a second terminal of the storage means, in response to the mode signal.

11. The logic device of claim 1, wherein while the connection block electrically connects the first and second logic blocks via a first one of the multiple connection configurations, the connection block is configured to select a second and a third one of the multiple connection configurations to connect the first and second logic blocks by performing a write operation on the connection cell.

12. The logic device of claim 11, wherein each of the first, second and third connection configurations comprise:
   a configuring means for configuring the desired function connected between the first connection line and the second connection line; and
   a storing means for configuring a connection between the first connection lines and the second connection lines, and
   each of the second connection configuration and the third connection configuration further include a writing means for applying a write voltage to the storing means.

13. The logic device of claim 1, further comprising:
   a third logic block configured to perform at least one function; and
   a second connection block electrically connected to the first logic block via the first connection lines, the second logic block via the second connection lines, and the third logic block via third connection lines.

14. The logic device of claim 13, wherein the second connection block has a same structure as the first connection block.

15. The logic device of claim 14, further comprising:
   a switch block configured to control a connection between the first connection block and the second connection block.

16. The logic device of claim 15, wherein the switch block comprises:
   a plurality of the connection cells, each connection cell configured to select one of the connection configurations between the first connection lines and the second connection lines based on the desired function.

17. The logic device of claim 1, wherein the desired function comprises:
   at least one of an error correction code (ECC) function, an arithmetic and logic unit (ALU) function, a compression function, and a security function.

18. An electronic device comprising:
   the logic device of claim 1.

19. A method of operating a logic device having a first logic block connected to first connection lines and a second logic block connected to second connection lines, the first logic block and the second logic block electrically connected to a connection block via the first connection lines and the second connection lines, respectively, the method comprising:
   selecting, by connection cells included in the connection block, a first one of multiple connection configurations between the first connection lines and the second connection lines to perform a function; and
   re-configuring the function performed by the logic device by performing a write operation, the re-configuring including selecting a second one of the multiple connection configurations while the connection block electrically connects the first and second logic blocks via the first one of the multiple connection configurations.

* * * * *